United States Patent
Han et al.

(10) Patent No.: US 9,778,502 B2
(45) Date of Patent: Oct. 3, 2017

(54) COLOR FILTER AND LIQUID CRYSTAL DISPLAY COMPRISING THE SAME

(71) Applicant: Shenzhen China Star Optoelectronics Technology Co., Ltd., Shenzhen, Guangdong (CN)

(72) Inventors: Bing Han, Guangdong (CN); Zuomin Liao, Guangdong (CN); Ming Hung Shih, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 14/417,603

(22) PCT Filed: Jan. 19, 2015

(86) PCT No.: PCT/CN2015/071052
§ 371 (c)(1),
(2) Date: May 4, 2016

(87) PCT Pub. No.: WO2016/095311
PCT Pub. Date: Jun. 23, 2016

(65) Prior Publication Data
US 2016/0246107 A1    Aug. 25, 2016

(30) Foreign Application Priority Data
Dec. 18, 2014 (CN) .......................... 2014 1 0798009

(51) Int. Cl.
*H01L 27/14* (2006.01)
*G02F 1/1335* (2006.01)
(Continued)

(52) U.S. Cl.
CPC ....... *G02F 1/133514* (2013.01); *G02B 5/201* (2013.01); *G09G 3/3648* (2013.01);
(Continued)

(58) Field of Classification Search
CPC ............... H01L 27/1214; G02F 1/1368; G02F 1/133514; G02F 2001/133622;
(Continued)

(56) References Cited

U.S. PATENT DOCUMENTS

| 4,288,812 A | 9/1981 | Rhodes |
| 2003/0169354 A1* | 9/2003 | Aotsuka ................. H04N 5/335 348/272 |

(Continued)

FOREIGN PATENT DOCUMENTS

| CN | 1825168 A | 8/2006 |
| CN | 2819256 Y | 9/2006 |

(Continued)

OTHER PUBLICATIONS

International Search Report and Written Opinion, China.
Chinese Office Action and Search Report Issued on Apr. 20, 2016.

*Primary Examiner* — Yosef Gebreyesus
(74) *Attorney, Agent, or Firm* — Kim Winston LLP

(57) ABSTRACT

Disclosed here is the technical field of liquid crystal display, and in particular to a color filter and a liquid crystal display with the color filter. The color filter has a plurality of diaphragm groups, each diaphragm group consists of at least one red diaphragm, at least one green diaphragm and at least one blue diaphragm, wherein the diaphragms of at least one of said diaphragm groups are configured in such a sequence that color cast caused by a RC delay of a pixel signal can be compensated.

7 Claims, 2 Drawing Sheets

Red (R)

Green (G)

Blue (B)

(51) Int. Cl.
*G02B 5/20* (2006.01)
*H01L 27/12* (2006.01)
*G09G 3/36* (2006.01)
*G02F 1/1368* (2006.01)

(52) U.S. Cl.
CPC ........ *H01L 27/1214* (2013.01); *G02F 1/1368* (2013.01); *G02F 2001/133622* (2013.01); *G09G 2300/0452* (2013.01); *G09G 2320/0209* (2013.01)

(58) Field of Classification Search
CPC .... G02B 5/201; G02B 5/2015; G09G 3/3648; G09G 2300/0452; G09G 2320/0209
See application file for complete search history.

(56) References Cited

U.S. PATENT DOCUMENTS

| | | | | |
|---|---|---|---|---|
| 2006/0012614 | A1* | 1/2006 | Asao | G02F 1/133514 345/690 |
| 2009/0015768 | A1* | 1/2009 | Igeta | G02F 1/133512 349/106 |
| 2011/0221797 | A1* | 9/2011 | Inada | G09G 3/3614 345/690 |

FOREIGN PATENT DOCUMENTS

| | | |
|---|---|---|
| CN | 103760725 A | 4/2013 |
| CN | 103926735 A | 7/2014 |
| CN | 103926741 A | 7/2014 |
| JP | 1987054774 A | 3/1987 |
| JP | 2005110022 A | 4/2005 |
| WO | 02085035 A1 | 10/2002 |

* cited by examiner

COLOR FILTER AND LIQUID CRYSTAL DISPLAY COMPRISING THE SAME

CROSS REFERENCE TO RELATED APPLICATION

The present application claims benefit of Chinese patent application CN 201410798009.1, entitled "Color Filter and Liquid Crystal Display Comprising the Same" and filed on Dec. 18, 2014, the entirety of which is incorporated herein by reference.

TECHNICAL FIELD

This disclosure relates to the technical field of Liquid Crystal Display (LCD), and especially to a color filter and a liquid crystal display comprising the color filter.

TECHNICAL BACKGROUND

A color filter is the most costly component in key components of an LCD, and occupies about 20% of all material costs in the material cost composition of a Thin Film Transistor Liquid Crystal Display (TFT-LCD) panel.

The color filter is used to generate RGB (Red, Green, Blue) colors through light filtering. Then, RGB colors are mixed in different proportions to generate various colors, such that the LCD can display in colors. Meanwhile, the color filter also plays a pivotal role for the width of the visual angle, luminance, resolution and the like of the TFT-LCD.

For instance, as for a fifth produced TFT-LCD, the material cost of its components is 70% of its total cost. The cost of the color filter is approximately 18.9% of the total cost. Calculated by the material cost alone, the cost of the color filter is up to 27%.

The materials for the color filter comprise glass substrate, color photoresist, ITO, Cr target for black frame, and so on. And the material cost occupies 60%-70% of the total cost of the color filter, whereby glass is the greatest item of the material cost of the color filter, which is approximately 40%. If the material cost contains the cost of the black frame, then the cost of glass exceeds 50%. The next one is the photoresist, which is 27%.

There are three fundamental colors, which are red, green, and blue separately. These three colors are not only main colored light obtained from the decomposition of white light, but also principle components of the mixed colored light, and additionally match spectral response range of human eye retina cell to meet the physiological effects of color vision of human eyes. Three kinds of colors mixed in different proportion can generate almost all colors in nature, with the greatest color gamut. Meanwhile, three kinds of colors are independent among one another, that is, one of the primary colors is unable to be generated by mixing other colors. Thus, Red (R), Green (G), and Blue (B) are named as three-primary colors of the colored light.

A subtractive color method is an approach for reproducing a color by subtracting the primary color(s) from the white light. Generally, the subtractive color method can be deemed as an approach for obtaining a color by overlapping three complementary colors that are cyan, magenta, and yellow. Each color is obtained by subtracting its complementary color from the white color.

An additive color method is an approach for generating, by adding RGB primary colors in different proportion, other colors.

The color LCD usually mixes colors using the additive color method.

The liquid crystals per se can only present black-and-white images. For colorful display, it is necessary to dispose color filters of RGB colors on a liquid crystal panel. In a thin film transistor (TFT) active matrix driven display, parallel electrodes are sequentially disposed into the color filters of RGB colors. Due to the problem of the mixed partial-color, a black matrix can be disposed among color coatings with different colors. The manufacturing quality of the black matrix would influence on the image resolution and color definition of the ultimate display image.

The RGB diaphragms of traditional color filters are arranged as illustrated in FIG. 1. Namely, in a plurality of columns of diaphragms, diaphragms are arranged in terms of Red diaphragm, Green diaphragm and Blue diaphragm.

However, as illustrated in FIG. 2, in a mixed color image, when signals sent to pixels through data lines are switched between a high voltage and a low voltage, a waveform for the inputted pixel data is better than the previous one due to RC delay. Therefore, the voltage charged into pixels later is higher, and thus the LCD will be brighter and one of the colors will be highlighted. There is an obvious color cast when the RC delay on both sides of the liquid crystal panel widely differs from the RC delay in the middle of the panel.

A pixel driven module of a display has been disclosed in CN 1549240A, wherein sub-pixels of RGB light are selected separately to form a pixel structure. One or two sub-pixels from the pixel device can be selected to widen, and the widened sub-pixels can be shared with an adjacent pixel structure so as to reduce the amount of sub-pixels, improve the acceptability and increase the resolution of the display. It, however, does not solve the above-mentioned problem as to color cast.

Therefore, during the procedure of designing the panel of the TFT-LCD, it is an important problem for designers to avoid the color cast. The external manifestation of the color cast is that colors in a mixed color image are distributed unevenly, whereby a kind of color will be highlighted. For example, a yellow image may appear in a shade of red. The color cast decreasing the display quality of the panel seriously must be solved. Accordingly, the present disclosure provides a color filter and a corresponding LCD, which can tactfully solve the problem of the color cast based on the principle of the color cast.

SUMMARY OF THE INVENTION

In traditional color filters, red diaphragms, green diaphragms and blue diaphragms are arranged in a sequence as illustrated in FIG. 1. When a mixed color image occurs, taking a yellow image RGB (128, 128, 0) as an example, red color will be deepened since the RC delay as shown in FIG. 2 causes the deviation of data waveform. And due to the arrangement of RGB, red color will be deepened all the time in yellow images. Therefore, the whole panel appears in a shade of red color.

In the color filter and the corresponding display according to the present disclosure, the arrangement of red diaphragms, green diaphragms and blue diaphragms is adjusted in such a sequence that red color in the display image in odd-numbered diaphragm groups is deepened, while green color in the display image in even-numbered diaphragm groups is deepened. In this way, there is no one of the colors that is highlighted all the time, and thus no color cast would occur in the whole image. Therefore, the problem of color cast can be thoroughly solved.

According to the present disclosure, a color filter is proposed. In embodiment 1, the color filter comprises a plurality of diaphragm groups, each diaphragm group consisting of at least one red diaphragm, at least one green diaphragm and at least one blue diaphragm, wherein the diaphragms of at least one of said diaphragm groups are configured in such a sequence that color cast caused by an RC delay of a pixel signal can be compensated. In this manner, the problem of color cast can be solved.

In embodiment 2 improved based on embodiment 1, the diaphragms in each odd-numbered diaphragm group are arranged in a cycle according to a sequence of red diaphragm, green diaphragm, and blue diaphragm. In this manner, e.g., when a yellow image is displayed, the difference of signal waveforms as a result of RC delay may cause the display image to appear in a shade of red color in odd-numbered diaphragm groups.

In embodiment 3 improved based on embodiment 1 or embodiment 2, the diaphragms in each even-numbered diaphragm group are arranged in a cycle according to a sequence of blue diaphragm, green diaphragm, and red diaphragm. In this case, e.g., when a yellow image is displayed, the difference of signal waveforms as a result of RC delay may cause the display image to appear in a shade of green color in odd-numbered diaphragm groups. Accordingly, the problem that the whole image appears in a shade of red color when yellow image is displayed can be solved.

In embodiment 4 improved based on the embodiment 1, the diaphragms of each diaphragm group are arranged in a cycle according to a sequence of red diaphragm, green diaphragm, blue diaphragm, blue diaphragm, green diaphragm, and red diaphragm. In this way, the problem of color cast can be solved, and the difference of signal waveforms caused by RC delay would not lead to one of the colors to be highlighted all the time.

According to the present disclosure, a liquid crystal display (LCD) is further proposed. In the example 1, said LCD comprises the above color filter according to the present disclosure.

In the example 2 improved based on the example 1 of the LCD, a voltage corresponding to a waveform written in the pixel signal is higher than that corresponding to a previous waveform.

In the example 3 improved based on the example 1 or the example 2, the RC delay is caused by a switchover between a high potential and a low potential.

In the example 4 improved based on any one of the examples 1 to 3, the display is a thin film transistor liquid crystal display (TFT-LCD).

In the example 5 improved based on any one of the examples 1 to 4, the diaphragms of the diaphragm groups are arranged in terms of color in a sequence so that red color in display images deepens in odd-numbered diaphragm groups.

In the example 6 improved based on any one of examples 1 to 5, the diaphragms of the diaphragm groups are arranged in terms of color in a sequence so that green color in display images deepens in even-numbered diaphragms. In this way, the difference of signal waveforms caused by RC delay would not cause one of the colors to be highlighted all the time, thereby the problem of the color cast can be solved.

As mentioned above, when the display panel of a TFT-LCD is designed, it is an important challenge for those skilled in the art to avoid mixed color cast. The problem of mixed color cast manifests in that the colors of a mixed color image are distributed unevenly, and one of the colors will be highlighted, for example, a yellow image would appear in a shade of red color. The color cast would seriously influence the display quality of the panel, and thus must be eliminated. Accordingly, the present disclosure proposes a color filter and a corresponding LCD, which can tactfully solve the problem of the color cast based on the principle of the color cast by means of intentional arrangements of RGB.

BRIEF DESCRIPTION OF THE DRAWINGS

In the following the present disclosure will be illustrated in detail based on non-limiting examples with reference to the accompanying drawings. In the drawings.

Figure 1:
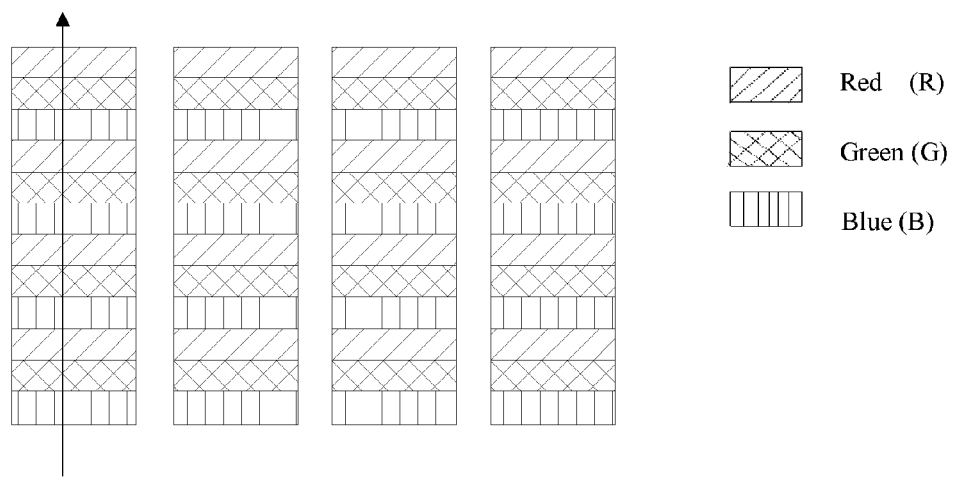
FIG. 1 shows the color sequence of diaphragms in several diaphragm groups of a color filter in the prior art, with the arrow therein representing a direction along which a data waveform is applied.

In the drawings, same components are indicated by the same reference sign. The drawings are not drawn to actual scale.

DETAILED DESCRIPTION OF THE EMBODIMENTS

The present disclosure will be explained in detail with reference to the accompanying drawings.

Figure 3:
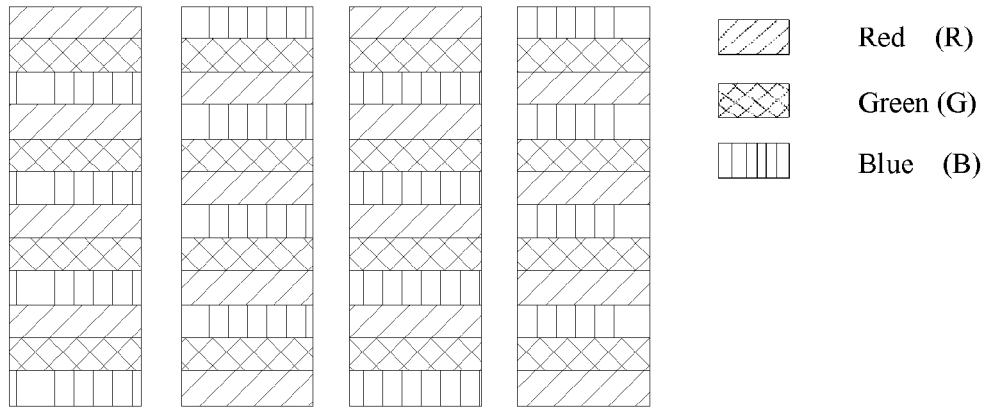
FIG. 3 shows an example of the color sequence of a diaphragm group of a color filter according to the present disclosure.

In the present disclosure, a color filter is proposed. Referring to FIG. 3, the color filter comprises a plurality of diaphragm groups, each consisting of at least one red diaphragm, at least one green diaphragm, and at least one blue diaphragm. The diaphragms of at least one of said diaphragm groups are configured in such a sequence that the color cast caused by an RC delay of a pixel signal can be compensated.

FIG. 3 shows an example of a color sequence of the color filter according to the present disclosure. Referring to FIG. 3, the diaphragms in odd-numbered diaphragm groups are arranged in a cycle according to a sequence of red diaphragm, green diaphragm, and blue diaphragm, and the diaphragms in even-numbered diaphragm groups are arranged in a cycle according to a sequence of blue diaphragm, green diaphragm, and red diaphragm.

Figure 2:
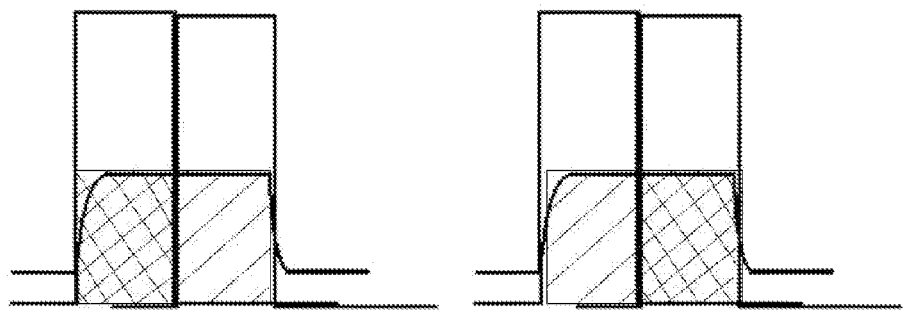
FIG. 2 shows signals applied on diaphragms of the color filter.

As illustrated in FIG. 2, when signals sent to pixels through data lines are switched between a high potential and a low potential, a waveform for the input pixel data is better than the previous one due to RC delay. Therefore, the voltage charged into pixels later is higher, and thus the LCD will be brighter, with one of the colors being highlighted. As the difference of data waveforms as illustrated in FIG. 2 occurs, red color in the display image will be deepened in odd-numbered diaphragm groups, while green color in the display image will be deepened in even-numbered diaphragm groups. In this way, there is no color cast in the whole image. Therefore, the problem of the color cast can be thoroughly solved.

Figure 4:
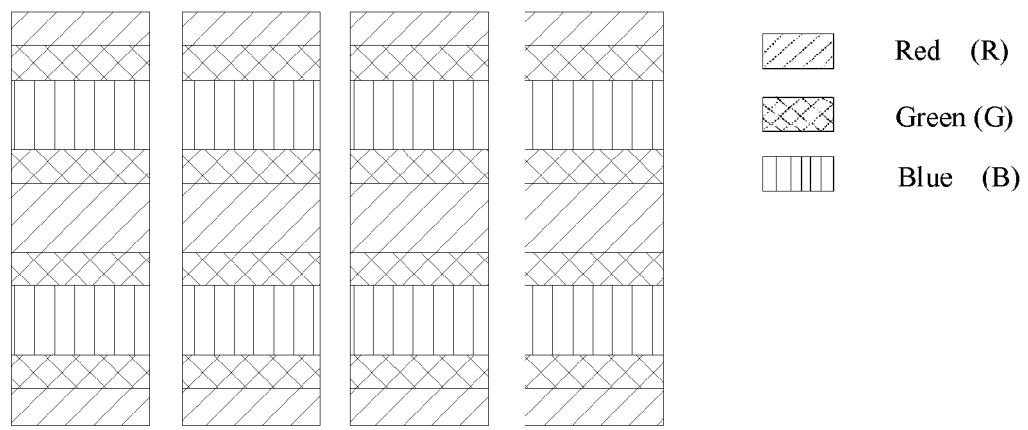
FIG. 4 shows another example of the color sequence of a diaphragm group of a color filter according to the present disclosure.

FIG. 4 shows another embodiment of the color sequence of the color filter according to the present disclosure. Referring to FIG. 4, the diaphragms of each of the diaphragm groups are arranged in a cycle according to a sequence of red diaphragm, green diaphragm, blue diaphragm, blue diaphragm, green diaphragm and red diaphragm. Based on such an arrangement, the color cast caused by the RC delay can be precisely compensated. The difference of the waveforms of the pixel signal data caused by the RC delay when the switchover between the high potential and the low potential occurs will not cause one of the colors to be highlighted all the time.

According to the present disclosure, a LCD is further proposed, comprising the color filter according to the present disclosure.

Referring to FIG. 2, due to the RC delay, in the LCD, the voltage corresponding to a waveform written in the signals, which are sent to the pixels through the data lines, is higher than the previous one, because a later waveform is better than a previous one. The RC delay is caused by the switchover between a high potential and a low potential. The LCDE can be a TFT-LCD, for example.

FIG. 2 shows signals applied on the color sequence of the color filter. The diaphragms of each of the diaphragm groups are arranged in terms of color in such a sequence that the red color of the display images deepens in odd-numbered diaphragm groups. Referring to FIG. 2, the left waveform diagram shows a principle for the red color of the display image to be deepened. This is because the signals sent to pixels through the data lines suffer from the RC delay when the switchover between a high potential and a low potential occurs, causing a former waveform of the data signal is less perfect than a latter one thereof, so that the voltage corresponding to the latter waveform is higher, and thus the voltage applied to the latter diaphragm is higher. As a result, the color of the latter diaphragm appears deeper. Therefore, the display image appears in a shade of red color when the voltage is applied to the red diaphragm after the green diaphragm.

Meanwhile, the diaphragms in each of the diaphragm groups are arranged in terms of color in such a sequence that the green color of the display images deepens in even-numbered diaphragm groups. Referring to FIG. 2, the right waveform diagram shows a principle for the green color of the display image to be deepened. This is because the signals sent to pixels through the data lines suffer from the RC delay when the switchover between a high potential and a low potential occurs, causing a former waveform of the data signal is less perfect than a latter one thereof, so that the voltage corresponding to the latter waveform is higher, and thus the voltage applied to the latter diaphragm is higher. As a result, the color of the latter diaphragm appears deeper. Therefore, the display image appears in a shade of green color when the voltage is applied to the green diaphragm after the red diaphragm.

In such a way, the defect that a display image as a whole appears in a shade of a certain color in the prior art can be solved Although the present disclosure has been described with reference to preferred embodiments, various modifications and variants to the present disclosure may be made by anyone skilled in the art, without departing from the scope and spirit of the present disclosure. In particular, as long as there is no structural conflict, various embodiments as well as the respective technical features mentioned herein may be combined with one another in any manner. The present disclosure is not limited to the specific examples disclosed herein, but rather includes all the technical solutions falling within the scope of the claims.

The invention claimed is:

1. A color filter, comprising a plurality of diaphragm groups, each diaphragm group consisting of at least one red diaphragm, at least one green diaphragm and at least one blue diaphragm, wherein the diaphragms of at least one of said diaphragm groups are configured in such a sequence that color cast caused by an RC delay of a pixel signal can be compensated, and wherein the diaphragms in each odd-numbered diaphragm group are periodically arranged according to a sequence of red diaphragm, green diaphragm, and blue diaphragm from top to bottom of a vertical direction, and the diaphragms in each even-numbered diaphragm group are periodically arranged according to a sequence of blue diaphragm, green diaphragm, and red diaphragm from top to bottom in the vertical direction.

2. A liquid crystal display, which includes a color filter comprising a plurality of diaphragm groups, each diaphragm group consisting of at least one red diaphragm, at least one green diaphragm and at least one blue diaphragm, wherein the diaphragms of at least one of said diaphragm groups are configured in such a sequence that color cast caused by an RC delay of a pixel signal can be compensated, and wherein the diaphragms in each odd-numbered diaphragm group are periodically arranged according to a sequence of red diaphragm, green diaphragm, and blue diaphragm from top to bottom in a vertical direction, and the diaphragms in each even-numbered diaphragm group are periodically arranged according to a sequence of blue diaphragm, green diaphragm, and red diaphragm from top to bottom in the vertical direction.

3. The liquid crystal display according to claim 2, wherein a voltage corresponding to a waveform written in the pixel signal is higher than that corresponding to a previous waveform.

4. The liquid crystal display according to claim 2, wherein the RC delay is caused by a switchover between a high potential and a low potential.

5. The liquid crystal display according to claim 2, wherein the liquid crystal display is a thin film transistor liquid crystal display.

6. The display according to claim 2, wherein the diaphragms of the diaphragm groups are arranged in terms of color in a sequence so that red color in display images deepens in even-numbered diaphragm groups.

7. The display according to claim 2, wherein the diaphragms of the diaphragm groups are arranged in terms of color in a sequence so that red color in display images deepen in odd-numbered diaphragm groups.

* * * * *